United States Patent [19]

Yool

[11] 4,429,417
[45] Jan. 31, 1984

[54] INTEGRATED ANTENNA, AMPLIFIER AND CONVERTER FOR MICROWAVE FREQUENCIES

[76] Inventor: George M. Yool, 2060 S. Val Vista, Apache Junction, Ariz. 85220

[21] Appl. No.: 166,595

[22] Filed: Jul. 7, 1980

[51] Int. Cl.³ ............................................. H04B 1/22
[52] U.S. Cl. .................................. 455/291; 455/293; 455/313; 455/323; 343/840
[58] Field of Search ............... 455/291, 281, 289, 293, 455/313, 318, 319, 320, 323, 325, 326, 327, 330, 332, 333, 331, 91, 117; 343/785, 840, 912

[56] References Cited

U.S. PATENT DOCUMENTS

| | | | |
|---|---|---|---|
| 2,603,743 | 7/1952 | Lawson | 455/91 |
| 3,120,640 | 2/1964 | Midlock | 455/91 |
| 3,659,204 | 4/1972 | Hufford | 455/281 |
| 3,671,868 | 6/1972 | Sanders | 455/325 |
| 3,735,267 | 5/1973 | Napoli | 455/327 |
| 3,823,380 | 7/1974 | Young | 455/319 |
| 4,005,433 | 1/1977 | Tsuda | 343/840 |

OTHER PUBLICATIONS

Hewlett-Packard Journal, Mar. 1973, Synthesized Signal Generation to 1.3 GHZ, by R. Hassun, et al., pp. 11-19.

*Primary Examiner*—Tommy P. Chin

[57] ABSTRACT

A microwave antenna has associated therewith an integrated amplifier and frequency converter circuit for operating frequencies of from 1 Ghz to 40 Ghz. The circuit may be tuned by variation of a voltage regulated supply which is impressed onto the center conductor of a coaxial output cable. The frequency selective tuning elements are strip lines etched on one side of a double sided printed circuit board. The receiver is designed as an integral part of a quarter spherical reflector which illuminates a resonant cavity in which a stub antenna is mounted. The stub antenna is also directly connected to an input transistor of the amplifier/converter circuit.

7 Claims, 3 Drawing Figures

INTEGRATED ANTENNA, AMPLIFIER AND CONVERTER FOR MICROWAVE FREQUENCIES

BACKGROUND OF THE INVENTION

1. Field of the Invention

This invention relates generally to microwave amplifiers and, more particularly to a microwave amplifier which converts the amplified signals to an unoccupied television channel; e.g. channels 2 to 6 in the low range TV band (58 to 78 Mhz). The overall microwave energy pickup is increased by integrating active components into a truncated quarter spherical wave reflector which feeds the open end of a resonant RF cavity.

2. Description of the Prior Art

Circuits for tuning, transferring and coupling signals in receiving systems operating above 500 Mhz have usually utilized passive elements with distributed constants such as resonant lines or cavities. Lumped parameter networks for such frequencies are usually unsatisfactory because the small values of "L" and "C" vary with environmental changes thus seriously altering the resonant characteristics. Before the advent of microwave transistors, active receiving elements comprised triodes generally connected in a grounded grid configuration. Traveling wave tubes for RF amplification at microwave frequencies and crystal mixers with positive grid or transit time oscillators for frequency conversion have also been utilized in receiving systems. Wave guides, cavity resonators and associated plumbing exhibit low losses with reasonable stability, but at 2-4 Ghz, such systems are bulky and expensive.

A stripline comprises a shaped metallic foil cemented to a dielectric substrate which in turn is cemented to an underlying solid foil or ground plane. Strip lines have been used for many years but they are difficult to integrate with active thermionic devices, and when etched on an ordinary dielectric constant substrate, they are almost as large as the waveguides they replace.

Foil coated high dielectric substrates have recently become available. These low loss substrates are plastic loaded with a titinate ceramic which has a high dielectric constant. This permits a reduction in strip line dimensions by a factor of three or four for comparable frequencies. The commercial availability of low loss printed circuit boards and good performing relatively inexpensive microwave transistors render it feasible to produce amplifiers and converters which will operate satisfactorily as high as 40 Ghz. Thus, microwave systems can now be built for the consumer market.

SUMMARY OF THE INVENTION

It is an object of the present invention to provide a high performance microwave amplifier circuit.

It is a further object of the invention that the microwave amplifier circuit be integrated into a reflector, a resonant cavity and a carefully positioned antenna which in turn drives an input transistor.

It is a still further object of the invention to provide a converter having an output frequency which is less than five percent of the amplified operating frequency.

Yet another object of the invention is to provide a microwave amplifier and converter circuit having a high frequency oscillator which operates at half the signal frequency.

A further object of the invention is to provide a converter circuit whose performance is improved by enhancement of the second harmonic of the high frequency oscillator output with microwave diodes.

It is a still further object of the invention to provide a converter circuit having an output frequency which can be controlled by changing the hetrodyne oscillator frequency over a range of ±5 percent (±10 percent at the operating frequency).

It is yet another object of the invention that the supply voltage to the amplifier, converter and high frequency oscillator be fed to the converter by superimposing a DC voltage on the coaxial cable used for the RF output of the converter.

Finally, it is an object of the invention to vary a regulated DC supply voltage supplied to the amplifier/converter over a range of +6 to +12 volts to tune the high frequency or hetrodyne oscillator without adversely affecting the amplifier or converter transistors.

The above, and other objects, features and advantages of the present invention will be more clearly understood from the following detailed description taken in conjunction with the accompanying drawings, in which:

DESCRIPTION OF THE PREFERRED EMBODIMENT

The embodiment described herein is dimensioned to operate in the fixed station band of from 1.99 to 2.4 Ghz; however, the circuit could be dimensioned to operate on higher or lower frequencies if desired.

Figure 1:
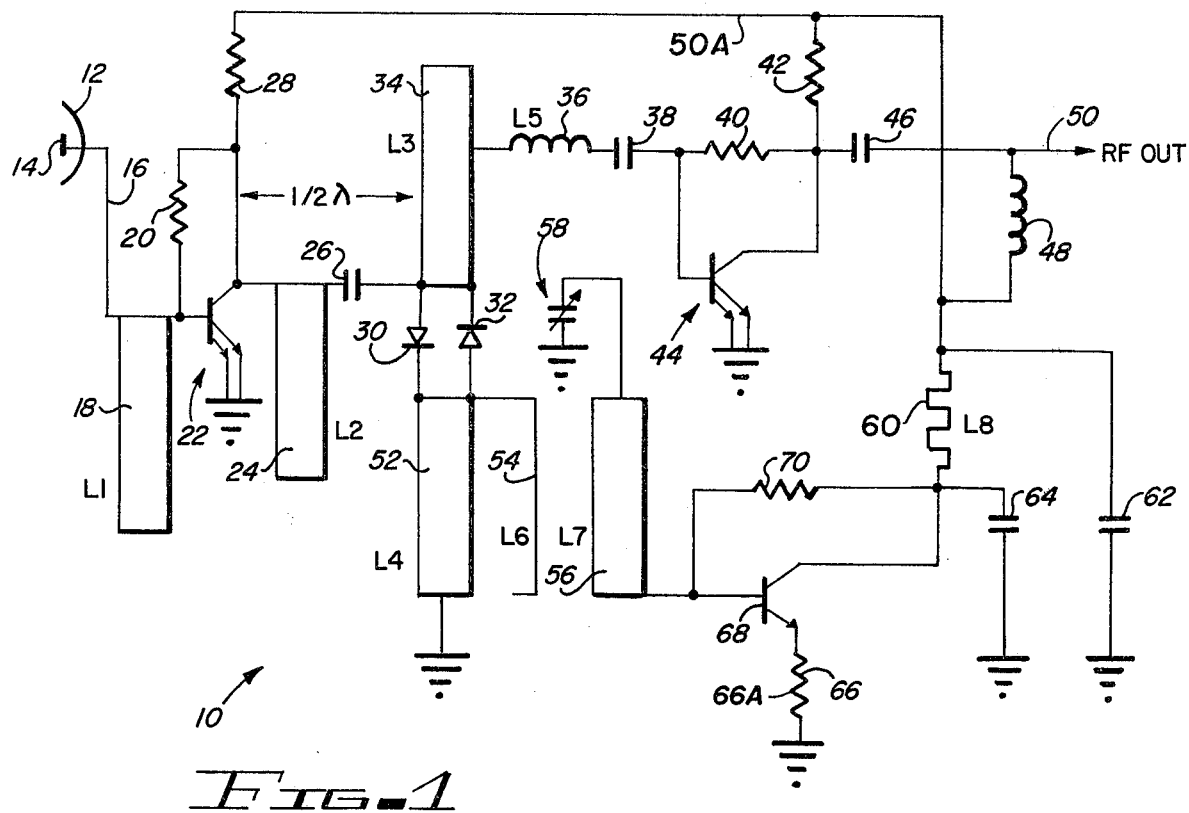
FIG. 1 is a schematic diagram of an amplifier/converter circuit fabricated from descrete components.
Figure 2:
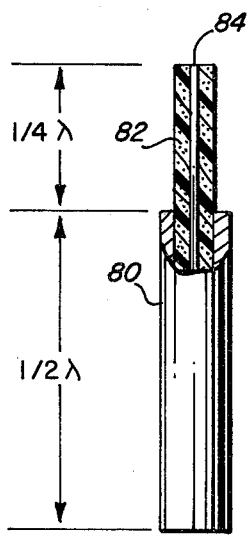
FIG. 2 is a partially cut-away view of a one-quarter wave length vertical antenna and a one-half wave length matching and supporting stub which is installed in a resonant cavity ($\frac{3}{4}\lambda$ by $1\frac{1}{2}\lambda$) which is part of the integrated antenna, amplifier, converter assembly.
Figure 3:
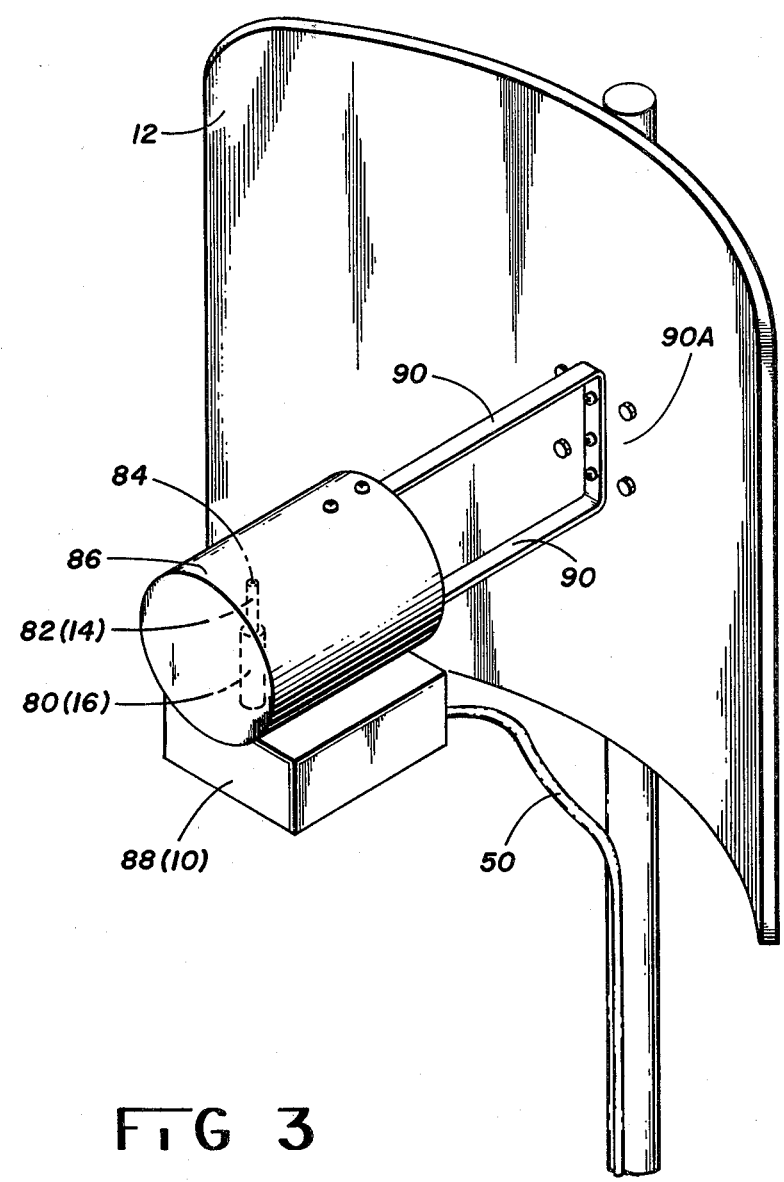
FIG. 3 illustrates a truncated spherical reflector and resonant cavity signal interceptor, and shows the location of a weatherproof amplifier/converter unit.

FIG. 1 illustrates the component content and stripline arrangement of an etched circuit board 10 which is approximately 46×115 mm. The reflector, antenna and feed line to the base of amplifier transistor 22 is shown as 12, 14 and 16 respectively. Additional antenna detils are shown in FIGS. 2 and 3. Antenna input line 16 (84 in FIGS. 2 and 3) is coupled directly to the base of microwave transistor 22 (e.g. a Hewlett Packard HXTR2101; at 4 Ghz and above, a Hewlett Packard HXTR6101 could be used).

The amplifier input is matched to the antenna by L1 which is an open ended eighth wave strip-line 18 connected to input line 16. Transistor 22 is biased by resistor 20 (e.g. 33 K$\Omega$, $\frac{1}{8}$ watt) coupled between the collector and base of transistor 22. The emitter(s) of transistor 22 is coupled to a ground plane (on the opposite side of the etched circuit board) through a hole in the substrate under transistor 22. A resistor 28 (e.g. 470$\Omega$, $\frac{1}{8}$ watt) is coupled between the B+ rail 50A to the collector of transistor 22 as an output load resistor. The output of amplifier transistor 22 is tuned to the signal frequency by an open ended $\frac{1}{8}$ wave strip line 24 which is carefully positioned to be decoupled from strip line 18.

An important feature of the microwave amplifier/converter circuit is the fact that the high frequency oscillator which comprises transistor 68 (e.g. a Motorola BFR 90) the base of which is coupled to eighth wave strip line 56 (L7) tuned by variable capacitor 58 (0.5–5 pf), operates on one half of the signal frequency plus or minus the converter output frequency. Use of the second harmonic of the high frequency oscillator as a signal converter effectively reduces interaction which is troublesome when an oscillator operates near the signal frequency at UHF and microwave frequencies.

The emitter of high frequency oscillator transistor 68 is coupled to the ground plane through unbypassed resistors 66-66A consisting of a thermister (1 KΩ @ 25 C.°) and a resistor (e.g. 1 KΩ ⅛ watt). The thermister is soldered directly to the emitter of transistor 68 in order to track its temperature. A resistor 70 (e.g. 15 KΩ, ⅛ watt) coupled between the collector and base of transistor 68 provides bias for the high frequency oscillator. The collector of transistor 68 is also coupled to the positive voltage through a small RF choke 60 etched on the circuit board. Choke 60 consists of five 1/16 inch square "U shaped" loops about 5/16 inches long with 0.01 uf ceramic capacitor 62 and 64 coupled between each end of the choke and the ground plane. Oscillator inductor 56 (L7) excites inductor 52 (L4) through a pickup loop 54 (L6) which is placed parallel to L7 and is connected to the open end of L4 which is a grounded quarter wave strip line operating at the oscillator frequency. A pair of differentially connected microwave diodes (e.g. MA 4882) 30 and 32 connects L4 to L3 (34) which is an open ended half wave strip line operating at the received frequency. The diode end of L3 is coupled to the collector of RF amplifier transistor 22 through ceramic coupling capacitor 26 (e.g. 10 pf). Strip line 34 is spatially separated from RF amplifier 22 by one half wavelength at the signal frequency so the connection from the collector of transistor 22 to the diodes at the end of L3 is also one half wavelength long. Thus, while the impedances at the collector of transistor 22 and diodes 30 and 32 are equal, a polarity reversal of the signal voltage occurs which contributes to the stability of the RF amplifier transistor 22.

The differentially connected diodes 30 and 32 between L4 and L3 function as a push-push doubler. Harmonics are generated when each diode is alternately driven to non-conduction. Thus, a high level of the second harmonic of the oscillator is present on strip line 34 (L3) which is one half wavelength long at twice the oscillator frequency plus or minus the converter output frequency. The signal frequency is mixed with the second harmonic of the high frequency oscillator output in L3(34) and conversion to an intermediate or difference frequency takes place. A tap at the one-quarter wave point on L3 is connected to the base of conversion amplifier transistor 44 via choke 36 (L5) and a coupling capacitor 38 (e.g. 0.01 uf). L5 (36) may consist of three turns, one-eight inch in diameter of number 22 AWG wire, each turn spaced one-eight inch apart. Choke L5 is installed to function as a low pass filter to reduce the level of the signal frequency and the oscillator harmonic and to enhance the level of the converted frequency.

Converter output transistor 44 may be an NEC 645 or NEC 64535. Bias is provided by resistor 40 (e.g. 15 kΩ, ⅛ watt) coupled between the collector and base of transistor 44. The dual emitters of transistor 44 are connected to the ground plane through a hole in the insulating substrate. Load resistor 42 (e.g. 470Ω, ⅛ watt) is coupled between the collector of transistor 44 and the positive voltage supply. The collector of transistor 44 is also coupled to a bulkhead connector (e.g. UG680), not shown, through an isolation capacitor 46 (e.g. 0.01 uf). The positive voltage feeder is connected to the UG680 connector through a choke 48 (e.g. 4.7 uh). An RF coaxial cable 50 (e.g. RG-58) fitted with, for example, a UG-536B plug is used for the converter RF output. The same cable is used to supply the positive voltage to the amplifier/converter unit from a closely regulated supply (not shown) which can be varied from 6 to 12 volts.

FIG. 2 shows a partially cut-away view of the antenna and feeder shown at 14 and 16 in FIG. 1. A half wavelength long metal stub 80 is soldered to the ground plane of the etched circuit board at a point where the inner conductor 84 can be connected directly to the base of RF amplifier transistor 22. Plastic insulation 82 provides mechanical support for the quarter wavelength stub antenna 84.

FIG. 3 is a perspective view of a reflector antenna assembly which incorporates the etched circuit microwave amplifier/converter shown in FIG. 1 and the antenna shown in FIG. 2. The metallic reflector 12 is approximately one-quarter of a spherical surface with a total diameter of 30 inches. Because the upper and lower portions of the spherical surface do not illuminate the antenna in the orientation used, the reflecting surface 12 has been truncated. A cylindrical cavity resonator 86 which is ⅝ wavelengths in diameter and 1¼ wavelengths long is supported by metal brackets 90 so the center of the open end of the cavity is approximately fifteen inches from the surface of the reflector. The cavity is excited in the TE mode by the intercepted energy, so the antenna is installed parallel to the diameter of the cavity at a location one-fifth wavelength from the closed end of the cavity corresponding to a voltage maximum. The antenna shown at 82 and 84 is supported by the tubular metallic member 80 which is electrically coupled to the etched circuit ground plane.

The amplifier converter circuit shown in FIG. 1 is housed in a weatherproof box 88 which is installed under RF cavity 86. RF output of the converter and DC input to the amplifier/converter 88 is provided by cable 50.

The orientation of reflector 12 and antenna 82 and 84 is for reception of vertically polarized RF energy. Removal and reinstallation of bolts 90A permit the "U" bolt bracket to be rotated 90 degrees. Reflector 12 and antenna assembly 82/84 would then be oriented for reception of horizontally polarized RF energy. Slotted bolt holes in the support bracket bolted to the reflector 12 back of 90A also permit the angle of elevation or depression of the antenna assembly to be varied.

While the invention has been described in accordance with a specific embodiment thereof, it will be apparent to those skilled in the art that changes in form and details may be made without departing from the scope of the invention as defined by the appended claims. For example, the specific frequencies mentioned are examples only. Further, dimensions, including antenna and cavity dimensions, can be derived for any signal frequency of interest between 1 Ghz and 40 Ghz.

What is claimed is:

1. A microwave amplifier and frequency down converter system, comprising:
   an antenna;
   first means coupled proximate said antenna for directing microwave energy to said antenna; and
   an integrated amplification and converter circuit means connected to said antenna for converting said microwave energy to RF energy, said first means comprises:

a resonant cavity; and a reflector for concentrating said microwave energy at the mouth of said resonant cavity, said antenna is mounted within said resonant cavity at a point of maximum voltage, said integrated circuit means is on a printed circuit board which is mechanically coupled proximate said resonant cavity, said antenna extending through said resonant cavity for electrical coupling to said printed circuit board, said circuit means comprises:

a first amplifier having an output tuned to the frequency of an input signal received by said antenna;

a high frequency oscillator; and second means coupled to said first amplifier and said oscillator for mixing outputs thereof to produce a first signal having a frequency substantially equal to the difference in frequency between said outputs, the output of said first amplifier is tuned to the frequency of the input signal by a first eighth-wave open-ended strip line on said printed circuit board.

2. A system according to claim 1 wherein the input of said first amplifier is matched with said antenna by a second eighth-wave open-ended strip line on said printed circuit board and coupled to the input of said first amplifier.

3. A system according to claim 2 wherein said second means comprises a push-push doubler including:

first and second half-wave strip lines on said printed circuit board; and first and second diodes differentially coupled between said first and second half-wave strip lines.

4. A system according to claim 2 wherein said first amplifier comprises a first transistor having first and second emitters coupled to ground, a base coupled to said antenna via said second eighth-wave strip line and a collector coupled to said second means via said first eighth-wave strip line.

5. A microwave amplifier and frequency converter system, comprising:

first means for amplifying a microwave signal; and integrated amplification and converter circuit means coupled to said first means for converting said amplified microwave signal to a VHF signal, said circuit means comprising high frequency oscillator means operating at half of the frequency of the amplified microwave signal plus or minus the converted output VHF signal, said integrated circuit is on a printed circuit board, said first means having a first amplifier having an output tuned to the frequency of an input signal, the output of said first amplifier is tuned to the frequency of the input signal by a first eighth-wave open-ended strip line, the input of said first amplifier is matched with said microwave signal by a second eighth-wave open-ended strip line coupled to the input of said first amplifier.

6. A system according to claim 5 wherein said first amplifier comprises a first transistor having first and second emitters coupled to ground, a base coupled to said microwave signal via said second eight-wave strip line, and a collector coupled to said circuit means via said first eight-wave strip line.

7. A microwave amplifier and frequency converter system, comprising:

first means for amplifying a microwave signal; and integrated amplification and converter circuit means coupled to said first means for converting said amplified microwave signal to a VHF signal, said circuit means comprising high frequency oscillator means operating at half of the frequency of the amplified microwave signal plus or minus the converted output VHF signal, said circuit means comprises a push-push doubler including:

first and second half-wave strip lines; and first and second diodes differentially coupled between said first and second half-wave strip lines.

* * * * *